(12) United States Patent
Chang (10) Patent No.: US 7,030,502 B2
(45) Date of Patent: Apr. 18, 2006

(54) BGA PACKAGE WITH SAME POWER BALLOUT ASSIGNMENT FOR WIRE BONDING PACKAGING AND FLIP CHIP PACKAGING

(75) Inventor: Nai-Shung Chang, Hsin-Tien (TW)

(73) Assignee: VIA Technologies Inc., Hsin-Tien (TW)

( * ) Notice: Subject to any disclaimer, the term of this patent is extended or adjusted under 35 U.S.C. 154(b) by 0 days.

(21) Appl. No.: 10/249,179

(22) Filed: Mar. 20, 2003

(65) Prior Publication Data

US 2004/0120128 A1 Jun. 24, 2004

(30) Foreign Application Priority Data

Dec. 24, 2002 (TW) ............................... 91137226 A (51) Int. Cl.
*H01L 23/48* (2006.01)
(52) U.S. Cl. ...................... 257/778; 257/784
(58) Field of Classification Search ................ 257/778, 257/784
See application file for complete search history.

(56) References Cited

U.S. PATENT DOCUMENTS

| 5,701,085 | A | * | 12/1997 | Malladi et al. ............. 324/754 |
| 5,767,575 | A | * | 6/1998 | Lan et al. ................... 257/701 |
| 6,222,260 | B1 | * | 4/2001 | Liang et al. ................ 257/691 |
| 6,476,472 | B1 | * | 11/2002 | Davison et al. ............. 257/678 |
| 6,489,682 | B1 | * | 12/2002 | Yeh et al. ................... 257/738 |
| 6,501,157 | B1 | * | 12/2002 | Cobbley ..................... 257/669 |
| 6,800,944 | B1 | * | 10/2004 | Buschbom .................. 257/778 |
| 2002/0153605 | A1 | * | 10/2002 | Chang ......................... 257/691 |
| 2002/0180040 | A1 | * | 12/2002 | Camenforte et al. ........ 257/738 |
| 2003/0042566 | A1 | * | 3/2003 | Chang et al. ............... 257/459 |
| 2003/0075812 | A1 | * | 4/2003 | Cheng et al. ............... 257/784 |
| 2003/0080353 | A1 | * | 5/2003 | Suwa et al. ................. 257/200 |
| 2003/0089983 | A1 | * | 5/2003 | Huang et al. ............... 257/738 |
| 2003/0111738 | A1 | * | 6/2003 | Buschbom .................. 257/778 |

* cited by examiner

*Primary Examiner*—Carl Whitehead, Jr.
*Assistant Examiner*—James M Mitchell
(74) *Attorney, Agent, or Firm*—Winston Hsu (57) ABSTRACT

A wire bonding BGA package. On a conductive metal layer of a substrate used for carrying a die, a power ring for providing an operating voltage to a core circuit of the die is disposed in the inner side of a power ring for providing an operating voltage to an input/output circuit of the die. When the die is packaged by flip chip packaging instead of wire bonding packaging, the power ballout assignment of the BGA package is unchanged and is suitable for matching with an original circuit board used for the flip chip BGA package. In addition, the present invention provides a flip chip BGA package. When the die is packaged by wire bonding packaging instead of flip chip packaging, the power ballout assignment of the BGA package is unchanged and is suitable for matching with an original circuit board used for the wire bonding BGA package.

12 Claims, 12 Drawing Sheets

BGA PACKAGE WITH SAME POWER BALLOUT ASSIGNMENT FOR WIRE BONDING PACKAGING AND FLIP CHIP PACKAGING

BACKGROUND OF INVENTION

1. Field of the Invention

The present invention relates to a ball grid array (BGA) package. In particular, the present invention discloses a BGA package with a same power ballout assignment for the wire bonding packaging and the flip chip packaging.

2. Description of the Prior Art

In modern society with developed computer technology, the computer system, which comprises a plurality of integrated circuits, has been utilized in a broad spectrum of fields. For example, household appliances with automatic control systems, mobile communication devices, and personal computers utilize integrated circuits to perform certain functions. Therefore, integrated circuits exist everywhere around the world. The main body of the IC is a die manufactured by a prior art semiconductor process. The manufacturing process of the die starts from forming a wafer. Each wafer is divided into a plurality of regions. On each region, many circuits are formed through the prior art semiconductor process. In the end, each processed region on the wafer is sliced to generate a plurality of dies. After the required die is obtained, it requires a specific way to electrically connect the processed die with a circuit board such as a printed circuit board (PCB). Therefore, the die is capable of acquiring its operating voltage from the PCB for performing a predetermined operation. For instance, suppose that the die corresponds to an encoder circuit. After the encoder circuit is provided with an appropriate operating voltage, the die (encoder circuit) is capable of encoding data inputted from the circuit board, and then returns the encoded data to the circuit board. Generally speaking, the specific way for electrically connecting the die with the circuit board comprises connecting a bare chip (die) directly with the circuit board, or packaging the die inside a package in advance so that the die is electrically connected to the outer circuit board through a circuit layout within the package for receiving power and transmitting signals.

The main purpose of the package is to provide a signal transmission interface between the die and the corresponding circuit board and a protective shield for the interior die. In addition, current electric appliances are developed to have a smaller size and a greater processing speed. Therefore, the package needs to increase a desired package pincount number, and simultaneously reduce the thickness and the area to meet user's requirement. In the past, the pin through hole (PTH) technology is particularly restricted by size of the holes that are positioned on the circuit board. Therefore, the actual size of the package cannot be greatly reduced owing to its inborn limitation. In addition, the package pincount number is accordingly restricted. Consequently, the surface mount technology (SMT) replaces the PTH technology to reduce actual size of the package. However, the above-mentioned surface mount technology and pin through hole technology belong to a peripheral packaging category. The peripheral packaging method has its own constitutional limitation on downsizing the package and increasing the package pincount number. Taking the SMT for example, when the total number of the pins located at peripheral of the package increases, the pitch between adjacent pins is accordingly shortened. When the package is installed upon the corresponding circuit board, the yield of the assembly, therefore, is deteriorated because the pitch between adjacent pins is too narrow. Therefore, an area array packaging technology such as a ball grid array (BGA) package is developed to solve the above problem. The package pins are not located at a peripheral of the package, but are located at an area of the package. Not only is the pitch between adjacent pins widened to improve yield of the assembly, but also the package pincount number is greatly increased. Based on different electrical connections for the die, the BGA packages are categorized into a wire bonding BGA package and a flip chip BGA package.

Figure 1:
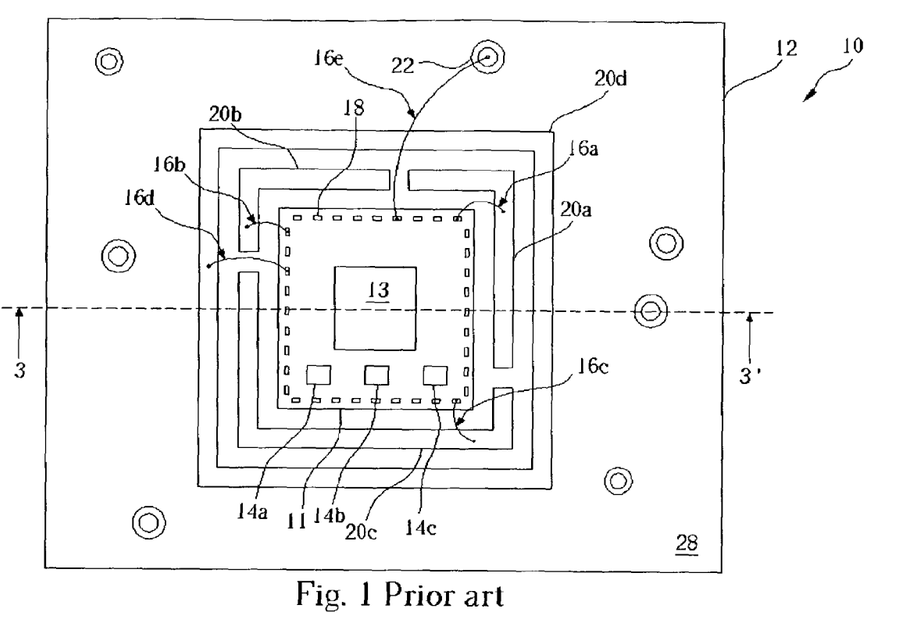
FIG. 1 is a first diagram of a prior art wire bonding BGA package.

Please refer to FIG. 1, which is a first diagram of a prior art wire bonding BGA package 10. The BGA package 10 has a die 11 and a substrate 12. The die 11 includes a core circuit 13 used for performing a predetermined operation, a plurality of input/output circuits 14a, 14b, 14c used for controlling signals inputted into the core circuit 13 and signals outputted from the core circuit 13, and a plurality of bonding pads 18 used for connecting the die 11 and the substrate 12. The substrate has a plurality of power rings 20a, 20b, 20c, 20d for carrying different operating voltages, and a plurality of solder joints 22. Besides, the power rings 20a, 20b, 20c and the solder joints 22 are both positioned on the same first layout layer 28. For example, suppose that the package 10 is a north bridge chip within a computer system. The die 11 is used to control signal transmission between high-speed peripheral devices (a memory and a graphics card for instance) and a microprocessor (a central processing unit (CPU) for instance). That is, the core circuit 13 of the die 11 dominates the kernel operation. On the other hand, the input/output circuits 14a, 14b, 14c, are respectively used to control signal transmission between the core circuit 13 and the memory, the graphics card, and the CPU. Please note that operating voltages of the memory, the graphics card, and the CPU are different to each other. For example, the memory needs an operating voltage equaling 2.6V, the graphics card using an accelerated graphics port (AGP) needs an operating voltage equaling 1.5V, and the CPU needs an operating voltage equaling 1.2V. That is, the memory uses 2.6V to represent a high logic value "1", and uses a ground voltage (0V) to stand for a low logic value "0". Therefore, the corresponding input/output circuit 14a has to use an operating voltage equaling 2.6V for correctly detecting logic values of a signal inputted from the memory and assigning logic values to a signal outputted to the memory. Similarly, the input/output circuit 14b has to use an operating voltage equaling 1.5V for correctly detecting logic values of a signal inputted from the graphics card and assigning logic values to a signal outputted to the graphics card, and the input/output circuit 14c has to use an operating voltage equaling 1.2V for correctly detecting logic values of a signal inputted from the CPU and assigning logic values to a signal outputted to the CPU. In addition, the core circuit 13 has an operating voltage different from that of each input/output circuit 14a, 14b, or 14c. The substrate 12, therefore, has to provide the core circuit 13 with an appropriate voltage such as 2.5V. The power rings 20a, 20b, 20c, 20d are respectively used to provide the input/output circuits 14a, 14b, 14c and the core circuit 13 with required operating voltages. It is noteworthy that bonding pads 18 corresponding to the input/output circuits 14a, 14b, 14c and the core circuit 13 are capable of transmitting signals and operating voltages. In FIG. 1, bonding wires 16a, 16b, 16c, 16d are used to connect the bonding pads 18 with the power rings 20a, 20b, 20c, 20d for individually inputting operating voltages into the input/output circuits 14a, 14b, 14c and the core circuit 13. Besides, bonding wire 16e is electrically connected between the bonding pad 18 and the corresponding solder joint 22 for transmitting signals. Every connection between the bonding wires and corresponding solder joints are not shown in FIG. 1 for simplicity. With the help of the bonding wires 16a, 16b, 16c, 16d, 16e, the die 11 can acquire desired operating voltages from the substrate 12, and the die 11 and the substrate 12 can transmit signals to each other.

Figure 2:
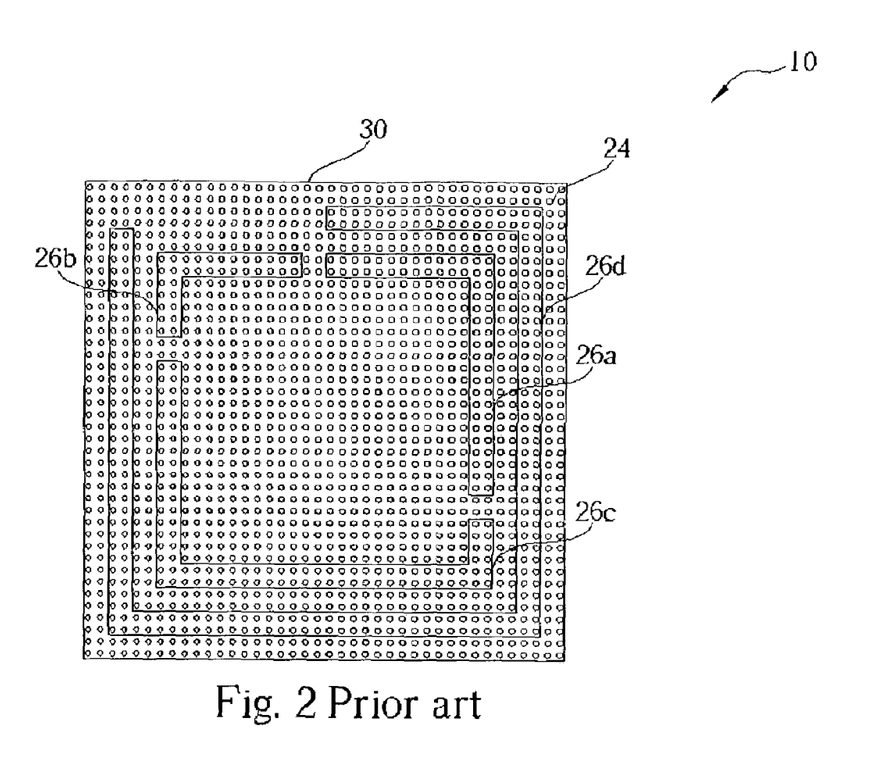
FIG. 2 is a second diagram of the wire bonding BGA package shown in FIG. 1.
Figure 3:
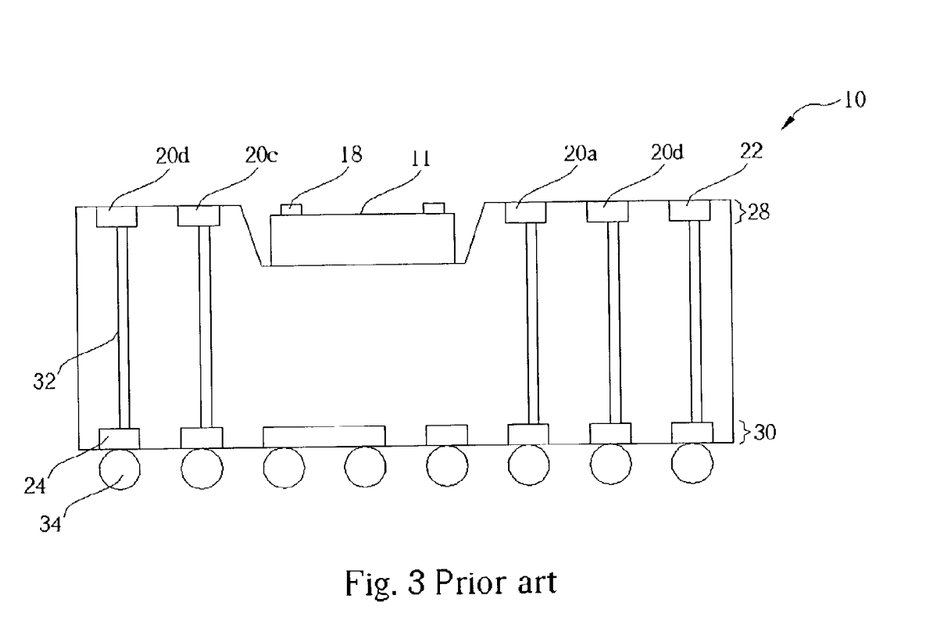
FIG. 3 is a section view along line 3–3" of the wire bonding BGA package shown in FIG. 1.

Please refer to FIG. 2 in conjunction with FIG. 3. FIG. 2 is a second diagram of the wire bonding BGA package 10 shown in FIG. 1, and FIG. 3 is a section view along line 3–3" of the wire bonding BGA package 10 shown in FIG. 1. The BGA package 10 has a plurality of ballouts 24 that are located at a second layout layer 30 according to a matrix format. The second layout layer 30 includes a plurality of conductive blocks 26a, 26b, 26c, 26d. Ballouts 24 positioned at each conductive block 26a, 26b, 26c, 26d are electrically connected to a circuit board that is used for inputting appropriate operating voltages to the input/output circuits 14a, 14b, 14c and the core circuit 13. As shown in FIG. 3, the first layout layer 28 and the second layout layer 30 are individually positioned at a top surface and a bottom surface of the BGA package 10. Please note that both FIG. 1 and FIG. 2 are top views so that the conductive blocks 26a, 26b, 26c, 26d and corresponding power rings 20a, 20b, 20c, 20d are capable of being electrically connected through vias 32. When the BGA package 10 is installed onto a circuit board through solder balls 34 at its bottom, the ballouts 24 corresponding to the solder balls 34 are electrically connected to the circuit board. Therefore, when the circuit board inputs voltages, the inputted voltages drive the input/output circuit 14a, 14b, 14c and the core circuit 13 through the solder balls 34, ballouts 24, vias 32, power rings 20a, 20b, 20c, 20d, bonding wires 16a, 16b, 16c, 16d, and bonding pads 18. Similarly, when the circuit board inputs signals into the input/output circuits 14a, 14b, 14c, the signals are transmitted to the input/output circuit 14a, 14b, 14c through the solder balls 34, ballouts 24, vias 32, solder joints 22, bonding wires 16e, and bonding pads 18. When the input/output circuits 14a, 14b, 14c outputs signals to the circuit board, the signals are transmitted through the bonding pads 18, bonding wires 16e, solder joints 22, vias 32, ballouts 24, and solder balls 34.

Figure 4:
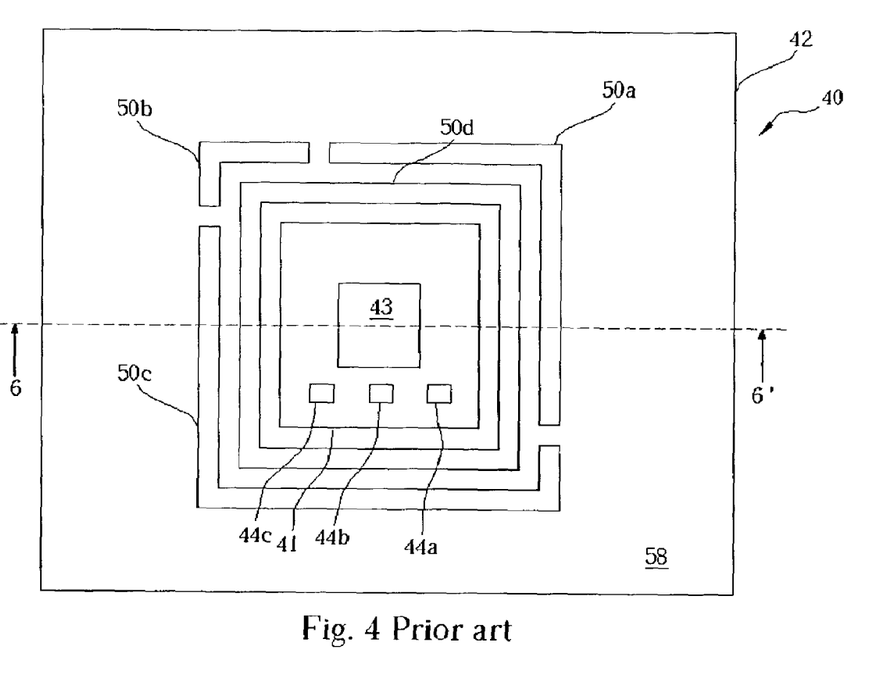
FIG. 4 is a first diagram of a prior art flip chip BGA package.
Figure 5:
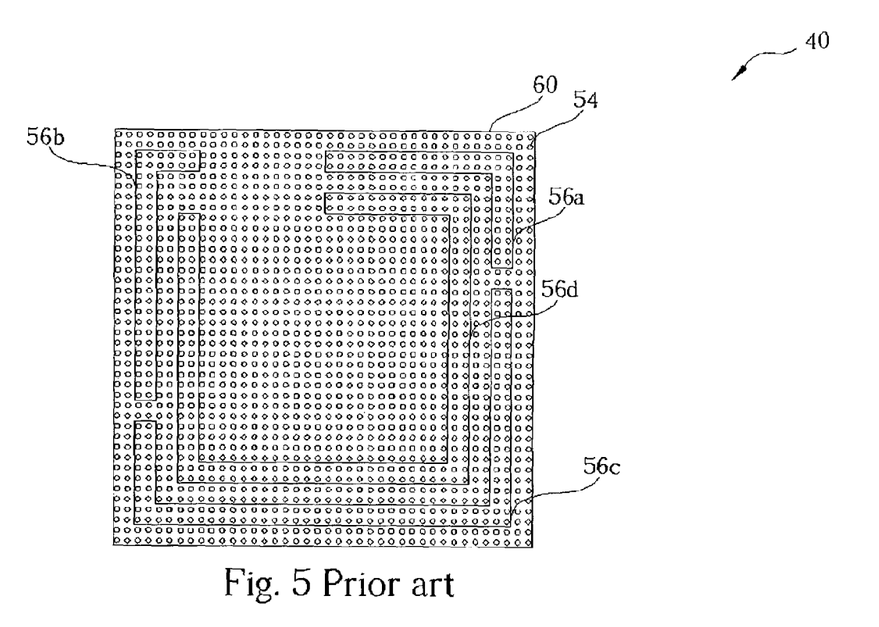
FIG. 5 is a second diagram of the flip chip BGA package shown in FIG. 4.
Figure 6:
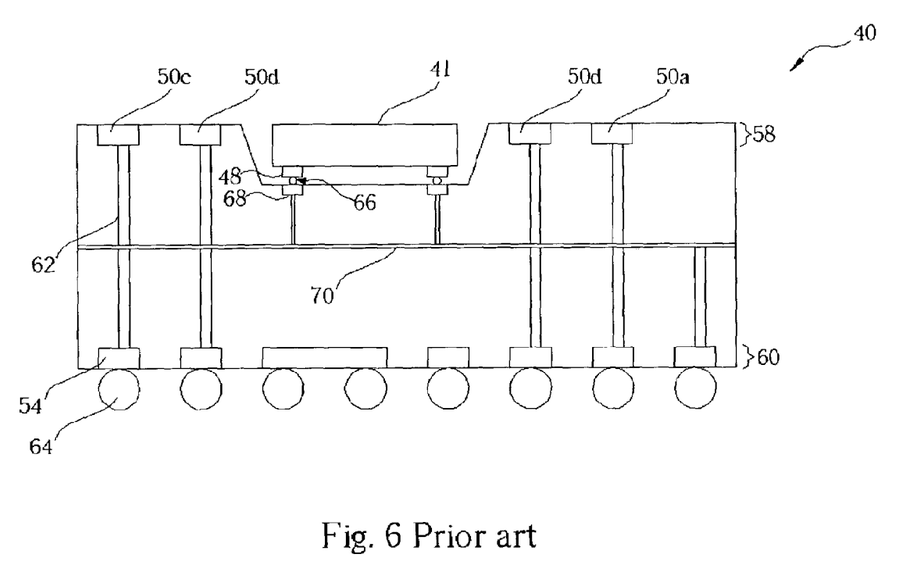
FIG. 6 is a section view along line 6–6" of the flip chip BGA package shown in FIG. 1.

Please refer to FIG. 4, FIG. 5, and FIG. 6. FIG. 4 is a first diagram of a prior art flip chip BGA package 40. FIG. 5 is a second diagram of the flip chip BGA package 40 shown in FIG. 4. FIG. 6 is a section view along line 6–6" of the flip chip BGA package 40 shown in FIG. 1. The BGA package 40 has a die 41 and a substrate 42. The die 41 includes a core circuit 43 and a plurality of input/output circuits 44a, 44b, 44c. The substrate 42 has a plurality of power rings 50a, 50b, 50c, 50d used for carrying different operating voltages, and the power rings 50a, 50b, 50c, 50d are positioned at the same first layout layer 58. Operation of the core circuit 43, the input/output circuits 44a, 44b, 44c, and power rings 50a, 50b, 50c, 50d is identical to the same elements of the above-mentioned wire bonding BGA package 10. Therefore, the lengthy description is skipped for simplicity. As shown in FIG. 5, the BGA package 40 has a plurality of ballouts 54 located at a second layout layer 60 according to a matrix format. The second layout layer 60 has a plurality of conductive blocks 56a, 56b, 56c, 56d. The ballouts 54 located at each conductive block 56a, 56b, 56c, 56d are used to connect a circuit board that is capable of providing the input/output circuits 44a, 44b, 44c and the core circuit 43 with appropriate operating voltages. The major difference between the flip chip BGA package 40 and the wire bonding BGA package 10 is that the die 41 is mounted by flipping over the die 11 shown in FIG. 1. In other words, the bonding pads 18 shown in FIG. 3 are located at top surface of the die 11, but the bonding pads 48 shown in FIG. 6 are located at bottom surface of the die 41. In addition, there is a metal bump 66 such as a solder bump or a gold bump formed on each bonding pad 48 so as to connect the corresponding contact 68 on the first layout layer 58 of the substrate 42. The power rings 50a, 50b, 50c, 50d and the contacts 68 (the first layout layer 58) are electrically connected to a third layout layer 70 through vias 62. With an adequate trace design for the third layout layer 70, the power rings 50a, 50b, 50c, 50d can transfer operating voltages to the core circuit 43 and the input/output circuits 44a, 44b, 44c through the corresponding contacts 68. Similarly, the third layout layer 70 is electrically connected to the second layout layer 60 through vias 62. Therefore, vias 62 can used to transmit signals and voltages to the die 41. Like the wire bonding BGA package 10, the flip chip BGA package 40 also adopts solder balls 64 to connect the circuit board.

Please refer to FIG. 1 in conjunction with FIG. 4. The wire bonding BGA package 10 and the flip chip BGA package 40 correspond to different power ring configurations. With regard to the wire bonding BGA package 10, the power rings 20a, 20b, 20c corresponding to the input/output circuits 14a, 14b, 14c are positioned inside the power ring 20d corresponding to the core circuit 13. On the contrary, with regard to the flip chip BGA package 40, the power rings 50a, 50b, 50c corresponding to the input/output circuits 44a, 44b, 44c are positioned outside the power ring 50d corresponding to the core circuit 43. In other words, each of the wire bonding BGA package 10 and the flip chip BGA package 40, as shown in FIG. 2 and FIG. 5, has a unique power ballout assignment. That is, when the dies with the same function are packaged by different packaging methods, two categories of BGA packages (the wire bonding BGA package 10 and the flip chip BGA package 40) correspond to different power ballout assignments. Because the power ballout assignments are not compatible with each other, circuit boards with different circuit layouts have to be adopted for respectively mounting the wire bonding BGA package 10 and the flip chip BGA package 40. Suppose that the packaging method suddenly alters. For example, the die is packaged to form the flip chip BGA package 40 instead of the wire bonding BGA package 10. Because the power ballout assignment of the wire bonding BGA package 10 is not compatible with that of the flip chip BGA package 40, the flip chip BGA package 40, therefore, cannot be installed on the circuit board that is originally designed to support the power ballout assignment of the wire bonding BGA package 10. If the manufacturer of the circuit board modifies layout design of the circuit board to meet requirement of the flip chip BGA package 40, the production cost of the circuit boards certainly increases. On the other hand, if the manufacturer of the circuit board refuses to alter original circuit layout suitable for the wire bonding BGA package 10, the flip chip BGA packages 40 are unmarketable so that corresponding inventory is increased. Therefore, the total production cost of the BGA packages increases.

SUMMARY OF INVENTION

It is therefore a primary objective of this invention to provide a BGA package with a same power ballout assignment for wire bonding packaging and flip chip packaging.

Briefly summarized, the preferred embodiment of the present invention discloses a ball grid array (BGA) package. The BGA package has a substrate and a die is mounted on the first layout layer of the substrate. The substrate has a first power ring positioned on a first layout layer of the substrate for transmitting a first operating voltage, a second power ring positioned on the first layout layer of the substrate for transmitting a second operating voltage, a plurality of first ballouts for connecting the BGA package with a circuit board to receive the first operating voltage provided by the circuit board, and a plurality of second ballouts for connecting the BGA package with the circuit board to receive the second operating voltage provided by the circuit board. The first ballouts are positioned on a first conductive block of a second layout layer of the substrate, and the first conductive block is electrically connected to the first power ring through at least a first via. The second ballouts are positioned on a second conductive block of the second layout layer of the substrate, and the second conductive block is electrically connected to the second power ring through at least a second via. The die has a core circuit for performing a predetermined operation, at least an input/output circuit (I/O circuit) electrically connected to the core circuit for controlling signals inputted into the core circuit and signals outputted from the core circuit, and a plurality of bonding pads positioned on a surface of the die. The bonding pads are respectively connected to the first and second power rings through a plurality of bonding wires for transmitting the first operating voltage to the core circuit and transmitting the second operating voltage to the I/O circuit. The first power ring is located between the second power ring and the die.

The preferred embodiment of the present invention further discloses a ball grid array (BGA) package. The BGA package has a substrate and a die. The substrate has a first power ring positioned on a first layout layer of the substrate for transmitting a first operating voltage, a second power ring positioned on the first layout layer of the substrate for transmitting a second operating voltage, a plurality of contacts positioned on the first layout layer, a plurality of first ballouts for connecting the BGA package with a circuit board to receive the first operating voltage provided by the circuit board, and a plurality of second ballouts for connecting the BGA package with the circuit board to receive the second operating voltage provided by the circuit board. The contacts are electrically connected to the first and second power rings through a third layout layer that lies in between the first and second layout layers. The first ballouts are positioned on a first conductive block of a second layout layer of the substrate, and the first conductive block is electrically connected to the first power ring through at least a first via. The second ballouts are positioned on a second conductive block of the second layout layer of the substrate, and the second conductive block is electrically connected to the second power ring through at least a second via. The die includes a core circuit for performing a predetermined operation, at least an input/output circuit (I/O circuit) electrically connected to the core circuit for controlling signals inputted into the core circuit and signals outputted from the core circuit, and a plurality of bonding pads positioned on a surface of the die. The bonding pads are respectively connected to the contacts for transmitting the first operating voltage to the core circuit and transmitting the second operating voltage to the I/O circuit. The second power ring is located inside the first power ring.

It is an advantage of the present invention that the claimed wire bonding BGA package has a substrate with a power ring corresponding to a core circuit of a die being allocated inside power rings corresponding to input/output circuits of the die, and the claimed flip chip BGA package has a substrate with a power ring corresponding to a core circuit of a die being allocated outside power rings corresponding to input/output circuits of the die. Therefore, circuit boards corresponding to the same power ballout assignment can be used to mount the claimed BGA packages packaged either by flip chip packaging or by wire bonding packaging. To sum up, the overall cost is greatly reduced.

These and other objectives of the present invention will no doubt become obvious to those of ordinary skill in the art after reading the following detailed description of the preferred embodiment, which is illustrated in the various figures and drawings.

DETAILED DESCRIPTION

Figure 7:
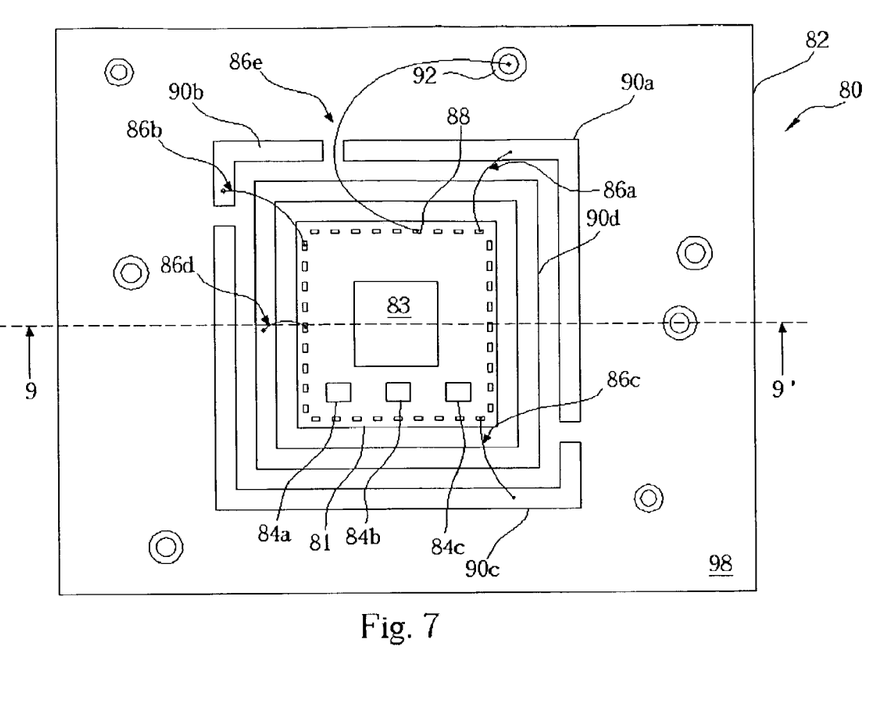
FIG. 7 is a first diagram of a wire bonding BGA package according to the present invention.

Please refer to FIG. 7, which is a first diagram of a wire bonding BGA package 80 according to the present invention. The BGA package 80 has a die 81 and a substrate 82. The die 81 includes a core circuit 83 used for performing a predetermined operation, a plurality of input/output circuits 84a, 84b, 84c used for controlling signals inputted into the core circuit 83 and signals outputted from the core circuit 83, and a plurality of bonding pads 88 used for connecting the die 81 and the substrate 82. A first layout layer 98 of the substrate 82 includes a plurality of power rings 90a, 90b, 90c, 90d for carrying operating voltages of the die 81, and a plurality of solder joints 92 for transmitting signals. Besides, the die 81 is electrically connected to the substrate 82 through a plurality of bonding wires 86a, 86b, 86c, 86d, wherein the bonding wires 86a, 86b, 86c respectively carry operating voltages to the die 81, and the bonding wire 86e is connected between the solder joint 92 and the corresponding bonding pad 88 for transmitting signals. For example, suppose that the package 80 is a north bridge chip within a computer system. The die 81 is used to control signal transmission between high-speed peripheral devices (a memory and a graphics card for instance) and a microprocessor (a central processing unit (CPU) for instance). That is, the core circuit 83 of the die 81 dominates the kernel operation. On the other band, the input/output circuits 84a, 84b, 84c are respectively used to control signal transmission between the core circuit 83 and the memory, the graphics card, and the CPU. As mentioned before, the input/output circuit 84a that corresponds to the memory, the input/output circuit 84b that corresponds to the graphics card, the input/output circuit 84c that corresponds to the CPU, and the core circuit 83 require different operating voltages to work properly. The power rings 90a, 90b, 90c, 90d, therefore, provide the corresponding input/output circuits 84a, 84b, 84c and the core circuit 83 with desired operating voltages. Without affecting disclosure of the present invention, it is noteworthy that connections between bonding wires 86 and solder joints 92 are not completely shown in FIG. 7 for simplicity. Bonding pads 88 corresponding to the input/output circuits 84a, 84b, 84c and the core circuit 83 are capable of transmitting signals and voltages. As shown in FIG. 7, the bonding wires 86a, 86b, 86c, 86d are individually used to connect the bonding pads 88 with the power rings 90a, 90b, 90c, 90d for inputting voltages to the input/output circuits 84a, 84b, 84c and the core circuit 83. In addition, the bonding wire 86e connects the bonding pad 88 and the solder joint 92 for transmitting signals. With the help of the bonding wires 86a, 86b, 86c, 86d, 86e, the die 81 can acquire desired operating voltages from the substrate 82, and the die 81 and the substrate 82 can transmit signals to each other.

Figure 8:
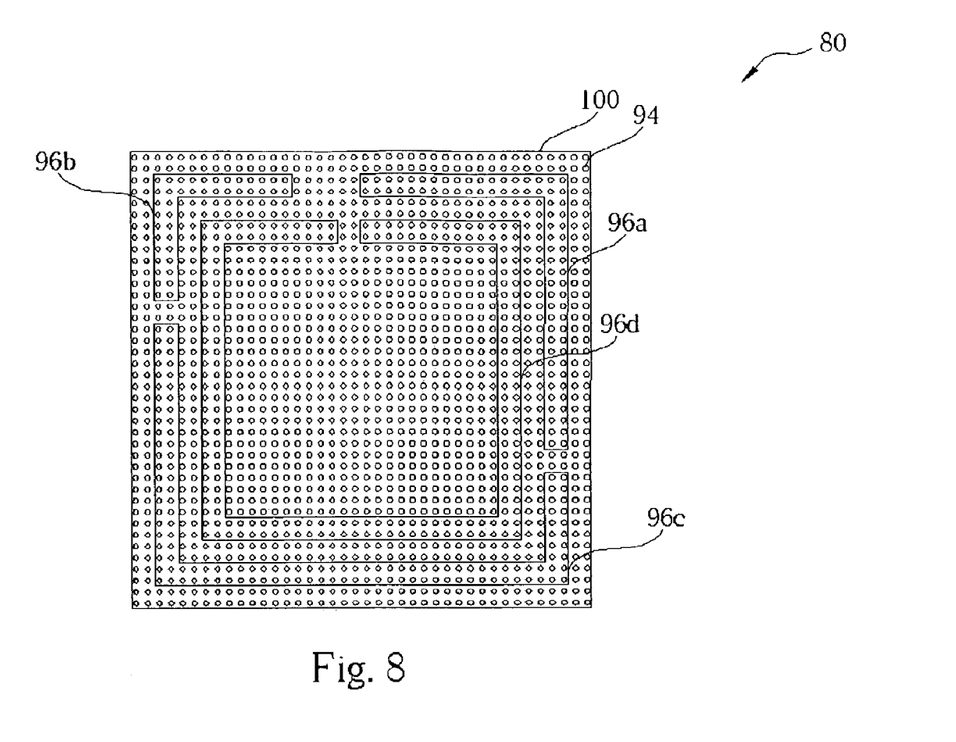
FIG. 8 is a second diagram of the wire bonding BGA package shown in FIG. 7.
Figure 9:
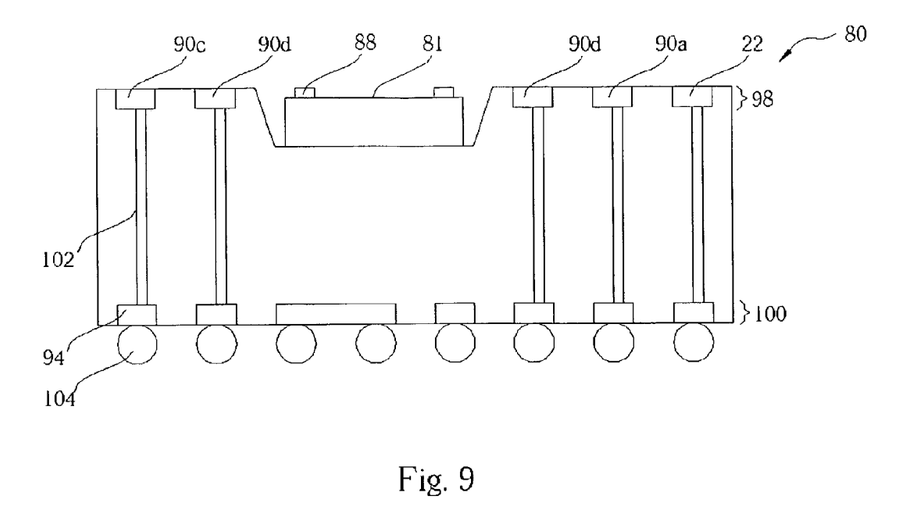
FIG.9 is a section view along line 9–9" of the wire bonding BGA package shown in FIG. 7.

Please refer to FIG. 8 in conjunction with FIG. 9. FIG. 8 is a second diagram of the wire bonding BGA package 80 shown in FIG. 7, and FIG. 9 is a section view along line 9–9" of the wire bonding BGA package 80 shown in FIG. 7. The BGA package 80 has a plurality of ballouts 94 that are located at a second layout layer 100 according to a matrix format. The second layout layer 100 includes a plurality of conductive blocks 96a, 96b, 96c, 96d. Ballouts 94 positioned at each conductive block 96a, 96b, 96c, 96d are connected to a circuit board that is capable of inputting appropriate operating voltages to the input/output circuits 84a, 84b, 84c and the core circuit 83. As shown in FIG. 9, the first layout layer 98 and the second layout layer 100 are individually positioned at top surface and bottom surface of the BGA package 80. Please note that both FIG. 7 and FIG. 8 are top views so that the conductive blocks 96a, 96b, 96c, 96d and corresponding power rings 90a, 90b, 90c, 90d are electrically connected through vias 102. When the BGA package 80 is installed onto a circuit board through metal balls such as solder balls 104 at its bottom, the ballouts 94 corresponding to the solder balls 104 are electrically connected to the circuit board. Therefore, when the circuit board inputs voltages to the BGA package 80, the inputted voltages drive the input/output circuit 84a, 84b, 84c and the core circuit 83 through the solder balls 104, ballouts 94, vias 102, power wigs 90a, 90b, 90c, 90d, bonding wires 86a, 86b, 86c, 86d, and bonding pads 88. Similarly, when the circuit board inputs signals into the input/output circuits 84a, 84b, 84c, the signals are transmitted to the input/output circuit 84a, 84b, 84c through the solder balls 104, ballouts 94, vias 102, solder joints 92, bonding wires 86e, and bonding pads 88. When the input/output circuits 84a, 84b, 84c outputs signals to the circuit board, the signals are transmitted through the bonding pads 88, bonding wires 86e, solder joints 92, vias 102, ballouts 94, and solder bails 104.

In the preferred embodiment, it is clearly shown in FIG. 7 and FIG. 8 that the power ring 90d on the first layout layer 98 is positioned between the die 81 and the power rings 90a, 90b, 90c. Therefore, the power ballouts corresponding to the power ring 90d are disposed inside the power ballouts corresponding to the power rings 90a, 90b, 90c. With regard to the circuit board that are used to match with the wire bonding BGA package 80, the solder joints corresponding to the power ring 90d must be positioned inside the solder joints corresponding to the power rings 90a, 90b, 90c so as to successfully mount the wire bonding BGA package 80. If packaging method of the die 81 is changed from the wire bonding packaging to flip chip packaging, the prior art flip chip BGA package 40 shown in FIG. 4 and FIG. 5 and the claimed wire bonding BGA package 80 have the same power ring configuration and the corresponding power ballout assignment. Therefore, after the die 81 is packaged according to the flip chip packaging, related ballouts used to carry operating voltages of the die 81 are capable of mating with the circuit board originally used to mount the wire bonding BGA package 80. For the suppliers of the package 80, the marketability of their products is improved. In addition, the suppliers of the circuit board need not greatly modify layout design of the circuit board.

Figure 10:
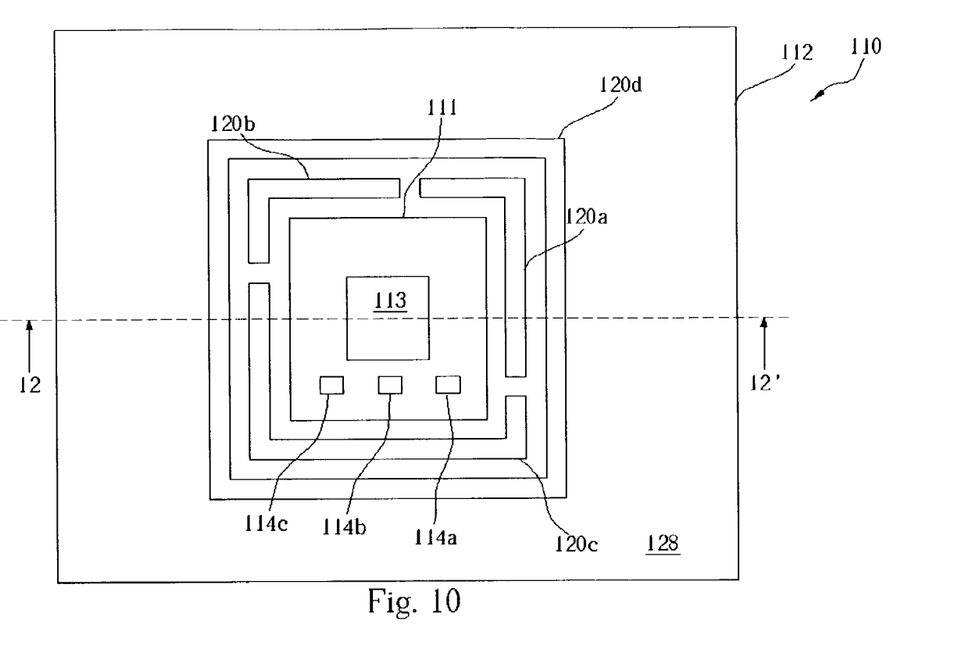
FIG. 10 is a first diagram of a flip chip BGA package according to the present invention.
Figure 11:
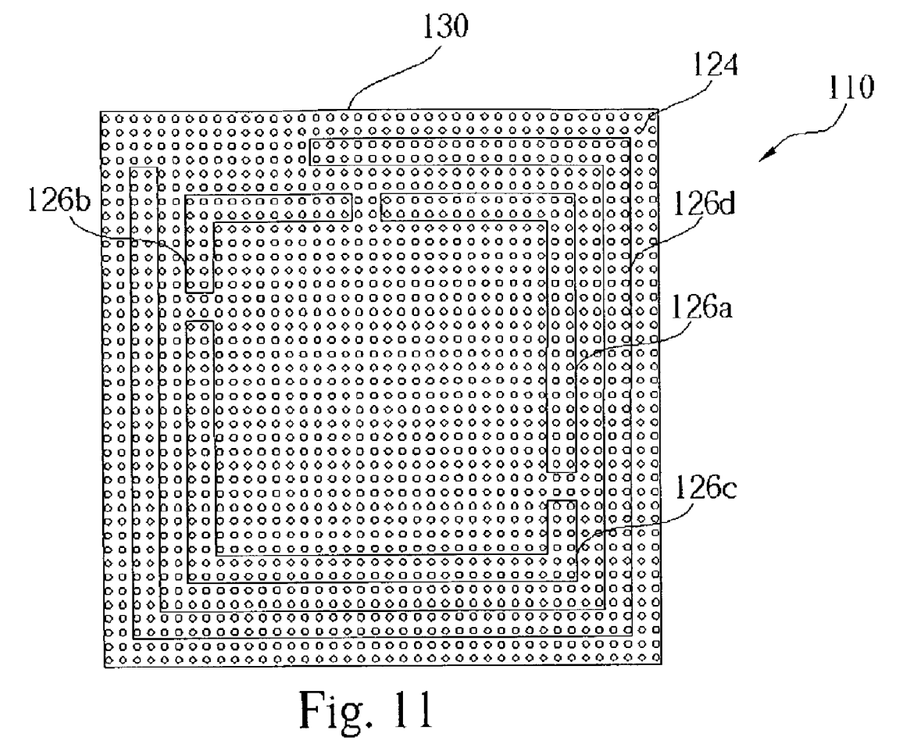
FIG. 11 is a second diagram of the flip chip BGA package shown in FIG. 10.
Figure 12:
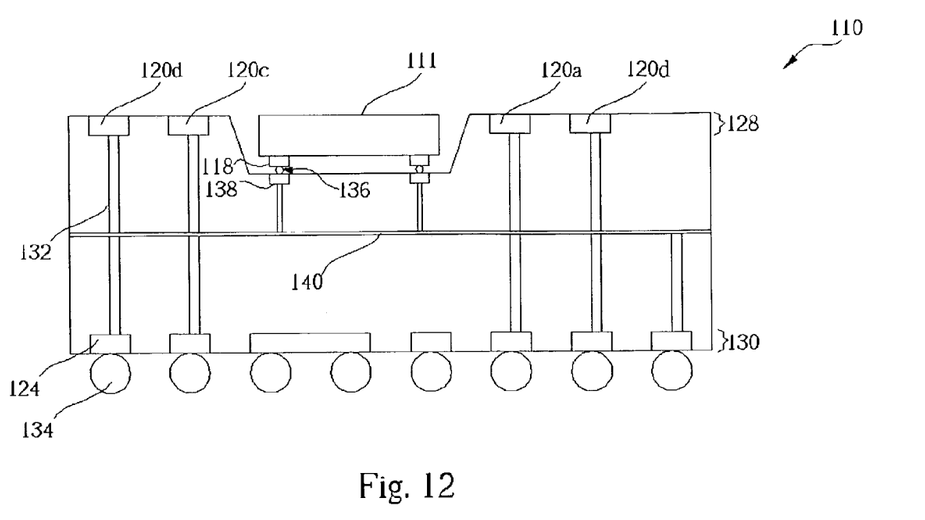
FIG. 12 is a section view along line 12–12" of the flip chip BGA package shown in FIG. 10.

Please refer to FIG. 10, FIG. 11, and FIG. 12. FIG. 10 is a first diagram of a flip chip BGA package 110 according to the present invention. FIG. 11 is a second diagram of the flip chip BGA package 110 shown in FIG. 10. FIG. 12 is a section view along line 12–12" of the flip chip BGA package 110 shown in FIG. 10. The BGA package 110 has a die 111 and a substrate 112. The die 111 includes a core circuit 113 and a plurality of input/output circuits 114a, 114b, 114c. The substrate 112 has a plurality of power rings 120a, 120b, 120c, 120d used for carrying different operating voltages, and the power rings 120a, 120b, 120c, 120d are positioned at the same first layout layer 128. Operation of the core circuit 113, the input/output circuits 114a, 114b, 114c, and power rings 120a, 120b, 120c, 120d is identical to the same elements of the above-mentioned wire bonding BGA package 80. Therefore, the lengthy description is skipped for simplicity. As shown in FIG. 11, the BGA package 110 has a plurality of ballouts 124 located at a second layout layer 130 according to a matrix format. The second layout layer 130 has a plurality of conductive blocks 126a, 126b, 126c, 126d. The ballouts 124 located at each conductive block 126a, 126b, 126c, 126d are used to connect a circuit board that is capable of providing the input/output circuits 114a, 114b, 114c and the core circuit 113 with appropriate operating voltages. The major difference between the flip chip BGA package 110 and the wire bonding BGA package 80 is that the die 111 is mounted after flipping over the die 80 shown in FIG. 12. In other words, the bonding pads 88 shown in FIG. 9 are located at top surface of the die 80, but the bonding pads 118 shown in FIG. 12 are located at bottom surface of the die 80. In addition, there is a metal bump 136 such as a solder bump or a gold bump formed on each pad 118 so as to connect the corresponding contact 138 on the first layout layer 128 of the substrate 112. The power rings 120a, 120b, 120c, 120d and the contacts 138 (the first layout layer 128) are electrically connected to a third layout layer 140 through vias 132. With an adequate trace design for the third layout layer 140, the power rings 120a, 120b, 120c, 120d can transfer operating voltages to the core circuit 113 and the input/output circuits 114a, 114b, 114c through the corresponding contacts 138. Similarly, the third layout layer 140 is electrically connected to the second layout layer 130 through vias 132. Therefore, vias 132 can be used to transmit signals and voltages to the die 111. Like the wire bonding BGA package 80, the flip chip BGA package 110 also adopts solder balls 134 to connect the circuit board.

In the preferred embodiment, it is clearly shown in FIG. 10 and FIG. 11 that the power ring 120a, 120b, 120c on the first layout layer 128 is positioned between the power ring 120d and the contacts 138 corresponding to the die 111.

Therefore, the power ballouts corresponding to the power ring 120d are disposed outside the power ballouts corresponding to the power rings 120a, 120b, 120c. With regard to the circuit board that is used to mate with the wire bonding BGA package 110, the solder joints corresponding to the ballouts of power ring 90d must be positioned outside the solder joints corresponding to ballouts of the power rings 120a, 120b, 120c so as to successfully mount the wire bonding BGA package 110. If packaging method of the die 111 is changed from the flip chip packaging to wire bonding packaging, the prior art wire bonding BGA package 10 shown in FIG. 1 and FIG. 2 and the claimed flip chip BGA package 110 have the same power ring configuration and the corresponding power ballout assignment. Therefore, after the die 111 is packaged according to the wire bonding packaging, related ballouts used to carry operating voltages of the die 111 are capable of mating with the circuit board originally used to mount the wire bonding BGA package 80. For the suppliers of the package 110, the marketability of their products is improved. In addition, the suppliers of the circuit board need not greatly modify layout design of the circuit board.

In contrast to the prior art, a wire bonding BGA package according to the present invention discloses a substrate with a power ring corresponding to a core circuit of a die being allocated inside power rings corresponding to input/output circuits of the die. When the die is packaged by flip chip packaging instead of the original wire bonding packaging, ballouts used to carry operating voltages of the die are capable of mating with a circuit board that is originally used to mount the wire bonding BGA package. Similarly, a flip chip BGA package according to the present invention discloses a substrate with a power ring corresponding to a core circuit of a die being allocated outside power rings corresponding to input/output circuits of the die. When the die is packaged by wire bonding packaging instead of the original flip chip packaging, ballouts used to carry operating voltages of the die are capable of mating with a circuit board that is originally used to mount the flip chip BGA package. If the supplier of the above-mentioned BGA package adopts another packaging method instead of the original one owing to cost concerns or other factors, the supplier of the circuit board needs not to greatly modify layout design of the circuit board. For the claimed BGA packages packaged by different packaging methods, the claimed BGA packages, therefore, use the same power ballout assignment so that are capable of mating with the same solder joint allocation defined on the circuit board. In other words, competitiveness of the claimed BGA packages is certainly improved. In addition, with regard to an electronic product comprising the circuit board and the BGA package, the overall production cost will not raise even though the packaging method of the BGA package changes during manufacture of the BGA packages. This is because that the circuit boards corresponding to the same power ballout assignment can be used to mount BGA packages packaged either by flip chip packaging or by wire bonding packaging. Compared with the prior art, the present invention is capable of greatly reducing production cost.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A flip chip ball grid array (BGA) package with a power ballout assignment of wire bonding packaging comprising:
   a substrate with a first layout layer and a second layout layer comprising:
      a first power ring positioned on the first layout layer of the substrate for transmitting a first operating voltage;
      a second power ring positioned on the first layout layer of the substrate for transmitting a second operating voltage;
      a plurality of first ballouts arranged to match first operating voltage contacts of a predetermined wire-bonding package circuit board to receive the first operating voltage provided by the circuit board, the first ballouts being positioned on a first conductive block of a the second layout layer of the substrate, the first conductive block being electrically connected to the first power ring through at least a first via; and
      a plurality of second ballouts arranged to match second operating voltage contacts of the circuit board to receive the second operating voltage provided by the circuit board, the second ballouts being positioned on a second conductive block of the second layout layer of the substrate, the second conductive block being electrically connected to the second power ring through at least a second via;
   a die comprising:
      a core circuit for performing a predetermined operation; and
      at least an input/output circuit (I/O circuit) electrically connected to the core circuit for controlling signals inputted into the core circuit and signals outputted from the core circuit; and
   a plurality of contacts positioned on the first layout layer, the contacts being electrically connected to the first and second power rings through a third layout layer that lies in between the first and second layout layers;
   wherein the first power ring and the second power ring are respectively contacted to the core circuit and the I/O circuit of the die;
   wherein the second power ring is located inside the first power ring;
   wherein the second ballouts corresponding to the second power ring are disposed inside the first ballouts corresponding to the first power ring.

2. The BGA package of claim 1, wherein the first ballouts and the second ballouts are connected to the circuit board via metal conductive balls.

3. The BGA package of claim 1, wherein said core logic is a north bridge chip of a computer system.

4. The BGA package of claim 1, wherein the die further comprises a plurality of metal bumps respectively formed on the bonding pads for connecting the bonding pads and the contacts.

5. The BGA package of claim 1, wherein the die is a wire bonding package or a flip chip package.

6. The BGA package of claim 1 further comprising a plurality of bonding pads on the surface of the die.

7. A flip chip ball grid array (BGA) package with a power ballout assignment of wire bonding packaging comprising:
   a substrate with a first surface and a second surface comprising:
      a first power ring positioned on a first surface of the substrate for transmitting a first operating voltage;
      a second power ring positioned on the first surface of the substrate for transmitting a second operating voltage;

a plurality of first ballouts arranged to match first operating voltage contacts of a predetermined wire-bonding package circuit board to receive the first operating voltage provided by the circuit board, the first ballouts being positioned on the second surface of the substrate and electrically connected to the first power ring; and a plurality of second ballouts arranged to match second operating voltage contacts of the circuit board to receive the second operating voltage provided by the circuit board, the second ballouts being positioned on the second surface of the substrate and electrically connected to the second power ring;

a die comprising:

a core circuit for performing a predetermined operation; and at least an input/output circuit (I/O circuit) electrically connected to the core circuit for controlling signals inputted into the core circuit and signals outputted from the core circuit; and a plurality of contacts positioned on the first surface, the contacts being electrically connected to the first and second power rings; and wherein the first power ring and the second power ring are respectively connected to the core circuit and the I/O circuit of the die;

wherein the second power ring is located inside the first power ring;

wherein the second ballouts corresponding to the second power ring are disposed inside the first ballouts corresponding to the first power ring.

8. The BGA package of claim 7, wherein the first ballouts and the second ballouts are connected to the circuit board via metal conductive balls.

9. The BGA package of claim 7, wherein said core circuit is a north bridge chip of a computer system.

10. The BGA package of claim 7, wherein the die further comprises a plurality of metal bumps respectively formed on the bonding pads for connecting the bonding pads and the contacts.

11. The BGA package of claim 7, wherein the die is a wire bonding package or a flip chip package.

12. The BGA package of claim 7 further comprising a plurality of bonding pads on the surface of the die.

* * * * *